(12) United States Patent
Gu et al.

(10) Patent No.: US 11,132,927 B2
(45) Date of Patent: Sep. 28, 2021

(54) SHIFT REGISTER AND DRIVING METHOD THEREOF, GATE DRIVING CIRCUIT AND DISPLAY DEVICE

(71) Applicants: BOE Technology Group Co., Ltd., Beijing (CN); Hefei BOE Optoelectronics Technology Co., Ltd., Anhui (CN)

(72) Inventors: Honggang Gu, Beijing (CN); Xianjie Shao, Beijing (CN); Lili Yao, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 514 days.

(21) Appl. No.: 16/303,853

(22) PCT Filed: May 25, 2018

(86) PCT No.: PCT/CN2018/088416
§ 371 (c)(1),
(2) Date: Nov. 21, 2018

(87) PCT Pub. No.: WO2019/033818
PCT Pub. Date: Feb. 21, 2019

(65) Prior Publication Data
US 2021/0225229 A1    Jul. 22, 2021

(30) Foreign Application Priority Data
Aug. 17, 2017    (CN) .......................... 201710707773.7

(51) Int. Cl.
*G09G 3/20*    (2006.01)
*G11C 19/28*    (2006.01)
*G06F 3/041*    (2006.01)

(52) U.S. Cl.
CPC ............... *G09G 3/20* (2013.01); *G11C 19/28* (2013.01); *G06F 3/0412* (2013.01);
(Continued)

(58) Field of Classification Search
CPC ............. G09G 3/20; G09G 2300/0426; G09G 2300/08; G09G 2310/0267;
(Continued)

(56) References Cited

U.S. PATENT DOCUMENTS

2014/0093028 A1    4/2014    Wu
2015/0346904 A1   12/2015    Long et al.
(Continued)

FOREIGN PATENT DOCUMENTS

CN    102779478 A    11/2012
CN    103996370 A     8/2014
(Continued)

OTHER PUBLICATIONS

Aug. 8, 2018—(WO) International Search Report and Written Opinion Appn PCT/CN2018/088416 with English Translation.
(Continued)

*Primary Examiner* — Charles V Hicks
(74) *Attorney, Agent, or Firm* — Banner & Witcoff, Ltd.

(57) ABSTRACT

A shift register, including: a first input circuit configured to supply a first reference signal of a first reference signal terminal to the pull-up node under control of an input signal of the input signal terminal; a pull-up node state maintaining circuit configured to supply a third reference signal of the third reference signal terminal to the pull-up node when the potential of the pull-up node is a first potential, and supply a fourth reference signal of the fourth reference signal terminal to the pull-up node when the potential of the pull-up node is a second potential; and an output circuit configured to output a first clock signal of the first clock signal terminal to the gate signal output terminal under control of the potential of the pull-up node.

20 Claims, 11 Drawing Sheets

(52) U.S. Cl.
CPC . *G06F 3/04166* (2019.05); *G09G 2300/0426* (2013.01); *G09G 2300/08* (2013.01); *G09G 2310/0267* (2013.01); *G09G 2310/0286* (2013.01); *G09G 2310/08* (2013.01)

(58) Field of Classification Search
CPC ....... G09G 2310/0286; G09G 2310/08; G11C 19/28; G06F 3/04166; G06F 3/0412
See application file for complete search history.

(56) References Cited

U.S. PATENT DOCUMENTS

| | | |
|---|---|---|
| 2017/0005786 A1* | 1/2017 | Perdoor .................. H03L 7/183 |
| 2017/0018245 A1 | 1/2017 | Park et al. |
| 2017/0108989 A1 | 4/2017 | Gu et al. |
| 2017/0162147 A1 | 6/2017 | Kim |
| 2017/0199617 A1 | 7/2017 | Gu et al. |

FOREIGN PATENT DOCUMENTS

| | | |
|---|---|---|
| CN | 104952417 A | 9/2015 |
| CN | 105185343 A | 12/2015 |
| CN | 105427830 A | 3/2016 |
| CN | 105931602 A | 9/2016 |
| CN | 106128347 A | 11/2016 |
| EP | 0622903 A2 | 11/1994 |

OTHER PUBLICATIONS

Jan. 21, 2020—(CN) First Office Action Appn 201710707773.7 with English Translation.

\* cited by examiner

SHIFT REGISTER AND DRIVING METHOD THEREOF, GATE DRIVING CIRCUIT AND DISPLAY DEVICE

CROSS-REFERENCE TO RELATED APPLICATIONS

This application is a U.S. National Phase Entry of International Application No. PCT/CN2018/088416 filed on May 25, 2018, designating the United States of America and claiming priority to Chinese Patent Application No. 201710707773.7, filed on Aug. 17, 2017. The present application claims priority to and the benefit of the above-identified applications and the above-identified applications are incorporated by reference herein in their entirety.

TECHNICAL FIELD

The present disclosure relates to a shift register and a driving method thereof, a gate driving circuit and a display device.

BACKGROUND

In the display panel, a gate enabling signal is usually supplied to a gate of each thin film transistor (TFT) in the pixel area through a gate driving circuit. The gate driving circuit may be formed on the array substrate of the flat display panel by an array process, that is, the Gate Driver on Array (GOA) process, such integration process not only saves cost but also can achieve a beautiful design of symmetry on two sides of the flat display panel. Meanwhile, it also leaves out the bonding area of the gate integrated circuit (IC) and the fan-out wiring space.

The gate driving circuit may be composed by a plurality of shift registers cascaded together, each stage of the shift registers is for supplying the gate enabling signal to gate lines connected to the signal output terminal of this stage of shift register, so as to turn on the TFT in the pixel area of the corresponding rows. Except the shift register at the first stage, the input signal terminal of the shift register at each of the rest stages is respectively connected to the signal output terminal of the shift register at the previous stage. The node that controls the signal output terminal to output the gate enabling signal in each stage of shift register is called a pull-up node. In the existing touch display panel with touch and display time division driving, a plurality of touch control periods are inserted during the time when one frame of picture is displayed, and each touch control period is set as a time interval of a certain time length. It is assumed that it enters the touch control period after output of the gate enabling signal at the signal output terminal of the shift register at the n-th stage is completed, at this time, the potential of the pull-up node in the shift register at the (n+1)-th stage has been pulled up to a high potential. Since the length of the touch control period is relatively long, during this period, the pull-up node in the shift register at the (n+1)-th stage may experience a leakage through the TFT connected thereto, thereby the potential of the pull-up node is lowered. When the touch control period is ended, the shift register at the (n+1)-th stage starts to operate, since the potential of the pull-up node thereof attenuates, the gate enabling signal outputted by the signal output terminal of the shift register is attenuated, which may even result in that TFT of the pixel area cannot be turned on, and display abnormality occurs to the touch display panel.

SUMMARY

An embodiment of the present disclosure provides a shift register, comprising: a first input circuit configured to input an input signal to a pull-up node; a pull-up node state maintaining circuit, a first terminal of the pull-up node state maintaining circuit being connected to a third reference signal terminal, a second terminal of the pull-up node state maintaining circuit being connected to a fourth reference signal terminal, and a third terminal of the pull-up node state maintaining circuit being connected to the pull-up node, and the pull-up node state maintaining circuit being configured to supply a third reference signal of the third reference signal terminal to the pull-up node when the potential of the pull-up node is a first potential, the third reference signal being used to maintain the potential of the pull-up node at the first potential, and supply a fourth reference signal of the fourth reference signal terminal to the pull-up node when the potential of the pull-up node is a second potential, the fourth reference signal being used to maintain the potential of the pull-up node at the second potential; and an output circuit configured to output a gate enabling signal at a gate signal output terminal under control of the potential of the pull-up node.

In some embodiments, the pull-up node state maintaining circuit comprises a control sub-circuit, a first potential maintaining sub-circuit and a second potential maintaining sub-circuit, wherein a first terminal of the control sub-circuit is connected to the third reference signal terminal, a second terminal of the control sub-circuit is connected to the pull-up node, a third terminal of the control sub-circuit is connected to the fourth reference signal terminal, and a fourth terminal of the control sub-circuit is connected to a first terminal of the second potential maintaining sub-circuit, the control sub-circuit is configured to output a control signal under control of the potential of the pull-up node and control turn-on and turn-off of the second potential maintaining sub-circuit; a first terminal of the first potential maintaining sub-circuit is connected to the third reference signal terminal, and a second terminal of the first potential maintaining sub-circuit is connected to the pull-up node and the second potential maintaining sub-circuit, the first potential maintaining sub-circuit is configured to input the third reference signal to the pull-up node when the second potential maintaining sub-circuit is turned off; and the first terminal of the second potential maintaining sub-circuit is connected to the control sub-circuit, a second terminal of the second potential maintaining sub-circuit is connected to the pull-up node, and a third terminal of the second potential maintaining sub-circuit is connected to the fourth reference signal terminal, the second potential maintaining sub-circuit is configured to input the fourth reference signal to the pull-up node when the second potential maintaining sub-circuit is turned on under the control of the control signal.

In some embodiments, the control sub-circuit comprises a first control transistor and a second control transistor, wherein a gate of the first control transistor is connected to the pull-up node, a first electrode of the first control transistor is connected to the fourth reference signal terminal, and a second electrode of the first control transistor is connected to the second potential maintaining sub-circuit and a second electrode of the second control transistor; a gate of the second control transistor is connected to a first electrode of the second control transistor and connected to the third reference signal terminal.

In some embodiments, the first potential maintaining sub-circuit comprises a first potential maintaining transistor, a gate of the first potential maintaining transistor is connected to a first electrode of the first potential maintaining transistor and connected to the third reference signal terminal, and a second electrode of the first potential maintaining transistor is connected to the pull-up node.

In some embodiments, the second potential maintaining sub-circuit comprises a second potential maintaining transistor, a gate of the second potential maintaining transistor is connected to the second electrode of the first control transistor, a first electrode of the second potential maintaining transistor is connected to the fourth reference signal terminal, and a second electrode of the second potential maintaining transistor is connected to the pull-up node.

In some embodiments, a channel width-to-length ratio of the first control transistor is greater than a channel width-to-length ratio of the second control transistor.

In some embodiments, a channel width-to-length ratio of the second potential maintaining transistor is greater than a channel width-to-length ratio of the first potential maintaining transistor.

In some embodiments, the first input circuit comprises a first input transistor, wherein a gate of the first input transistor is connected to an input signal terminal, a first electrode of the first input transistor is connected to the first reference signal terminal, and a second electrode of the first input transistor is connected to the pull-up node.

In some embodiments, the shift register further comprises: a second input circuit, a first terminal of the second input circuit is connected to a reset signal terminal, a second terminal of the second input circuit is connected to a second reference signal terminal, a third terminal of the second input circuit is connected to the pull-up node, wherein the second input circuit is configured to supply a signal of the second reference signal terminal to the pull-up node under control of a reset signal of the reset signal terminal.

In some embodiments, the second input circuit comprises a second input transistor, wherein a gate of the second input transistor is connected to the reset signal terminal, a first electrode of the second input transistor is connected to the second reference signal terminal, and a second electrode of the second input transistor is connected to the pull-up node. Each of registers is used to output.

In some embodiments, the shift register further comprises: a pull-down control circuit, a first terminal of the pull-down control circuit being connected to the pull-up node, a second terminal of the pull-down control circuit being connected to the third reference signal terminal, a third terminal of the pull-down control circuit being connected to the fourth reference signal terminal, and a fourth terminal of the pull-down control circuit being connected to a pull-down node of the shift register, wherein the pull-down control circuit is configured to supply a signal of the fourth reference signal terminal to the pull-down node when the pull-up node is at the first potential, and supply a signal of the third reference signal terminal to the pull-down node when the pull-up node is at the second potential.

In some embodiments, the pull-down control circuit comprises: a first pull-down control transistor, a second pull-down control transistor, a third pull-down control transistor and a fourth pull-down control transistor; wherein a gate of the first pull-down control transistor is connected to the pull-up node, a first electrode of the first pull-down control transistor is connected to the fourth reference signal terminal, and a second electrode of the first pull-down control transistor is connected to the pull-down node; a gate of the second pull-down control transistor is connected to the pull-up node, a first electrode of the second pull-down control transistor is connected to the fourth reference signal terminal, and a second electrode of the second pull-down control transistor is connected to a gate of the third pull-down control transistor and a second electrode of the fourth pull-down control transistor respectively; the gate of the third pull-down control transistor is connected to a second electrode of the fourth pull-down control transistor and the second electrode of the second pull-down control transistor respectively, a first electrode of the third pull-down control transistor is connected to the third reference signal terminal, and a second electrode of the third pull-down control transistor is connected to the pull-down node; a gate of the fourth pull-down control transistor is connected to a first electrode of the fourth pull-down control transistor and connected to the third reference signal terminal, and the second electrode of the fourth pull-down control transistor is connected to the gate of the third pull-down control transistor and the second electrode of the second pull-down control transistor.

In some embodiments, the shift register further comprises: a pull-down circuit, a first terminal of the pull-down circuit being connected to the pull-down node, a second terminal of the pull-down circuit being connected to the pull-up node, a third terminal of the pull-down circuit being connected to the gate signal output terminal, and a fourth terminal of the pull-down circuit being connected to the fourth reference signal terminal, wherein the pull-down circuit is configured to supply a signal of the fourth reference signal terminal to the pull-up node and the gate signal output terminal under control of the potential of the pull-down node.

In some embodiments, the pull-down circuit comprises: a first pull-down transistor and a second pull-down transistor; wherein a gate of the first pull-down transistor is connected to the pull-down node, a first electrode of the first pull-down transistor is connected to the fourth reference signal terminal, and a second electrode of the first pull-down transistor is connected to the gate signal output terminal; a gate of the second pull-down transistor is connected to the pull-down node, a first electrode of the second pull-down transistor is connected to the fourth reference signal terminal, and a second electrode of the second pull-down transistor is connected to the pull-up node.

In some embodiments, the output circuit comprises: an output transistor and a first capacitor; wherein a gate of the output transistor is connected to the pull-up node, a first electrode of the output transistor is connected to a first clock signal terminal, and a second electrode of the output transistor is connected to the gate signal output terminal; a first terminal of the first capacitor is connected to the pull-up node, and a second terminal of the first capacitor is connected to the gate signal output terminal.

In some embodiments, the shift register further comprises: a denoising circuit, wherein a first terminal of the denoising circuit is connected to the gate signal output terminal, a second terminal of the denoising circuit is connected to the pull-up node, a third terminal of the denoising circuit is connected to the fourth reference signal terminal, and a fourth terminal of the denoising circuit is connected to a denoising signal terminal; the denoising circuit is configured to supply a signal of the fourth reference signal terminal to the gate signal output terminal and the pull-up node under control of a denoising signal of the denoising signal terminal.

Correspondingly, an embodiment of the present disclosure further provides a gate driving circuit, comprising a plurality of shift registers as provided by the embodiments of the present disclosure.

Correspondingly, an embodiment of the present disclosure further provides a display device comprising any of the gate driving circuits provided above by the embodiments of the present disclosure.

Correspondingly, an embodiment of the present disclosure further provides a driving method of the shift register as described above, comprising: receiving an input signal, and pulling up the pull-up node to a turn-on voltage level according to the input signal; maintaining the potential of the pull-up node at the turn-on voltage level by the pull-up node state maintaining circuit; and receiving a first clock signal and outputting a gate enabling signal at the output terminal under control of the potential of the pull-up node based on the first clock signal.

In some embodiments, the driving method further comprises: receiving a reset signal, and pulling down the pull-up node to a turn-off voltage level according to the reset signal; maintaining the potential of the pull-up node at the turn-off voltage level by the pull-up node state maintaining circuit.

By means of adopting the shift register provided by the embodiments of the present disclosure, the pull-up node state maintaining circuit provided by the present disclosure is used to maintain the potential of the pull-up node, which can keep the potential of the pull-up node from attenuating with time, thereby ensuring stable output of the shift register.

BRIEF DESCRIPTION OF THE DRAWINGS

In order to more clearly illustrate the technical solutions of the embodiments of the present disclosure, hereinafter, the drawings necessary for illustration of the embodiments of the present application will be introduced briefly, the drawings described below are only some embodiments of the present disclosure, it is possible for the person of ordinary skill in the art to obtain other drawings based on these drawings without paying creative efforts. The following drawings are focused on showing the subject matter of the present application, not schematically scaled by actual dimensions.

DETAILED DESCRIPTION OF THE EMBODIMENTS

Hereinafter, to make the objectives, technical solutions, and advantages of the present disclosure more clear, exemplary embodiments of the present disclosure will be described in detail with reference to the accompanying drawings. Obviously, these described embodiments are merely parts of the embodiments of the present disclosure, rather than all of the embodiments thereof. Other embodiments obtained by the person of ordinary skill in the art based on the embodiments of the present disclosure without paying creative effort all fall into the protection scope of the present disclosure.

Unless otherwise defined, technical terms or scientific terms used herein shall have common meaning known by the person skilled in the art of the present disclosure. Words and expressions such as "first", "second" and the like used in the specification and claims of the present disclosure do not denote any sequence, quantity or priority, but distinguish different components. Likewise, words such as "include", "comprise" and the like refer to that an element or an object before this word contains all the elements or objects listed thereinafter or alternatives thereof, without excluding other elements or objects. Words such as "connected", "connecting" and the like are not restricted to physical or mechanical connections, but may include electrical connections, regardless of direct or indirect connections. Words such as "up", "below", "left", "right", etc., are only used to denote relative positional relationship, once an absolute position of the described object changes, the relative positional relationship may probably change correspondingly.

Figure 1:
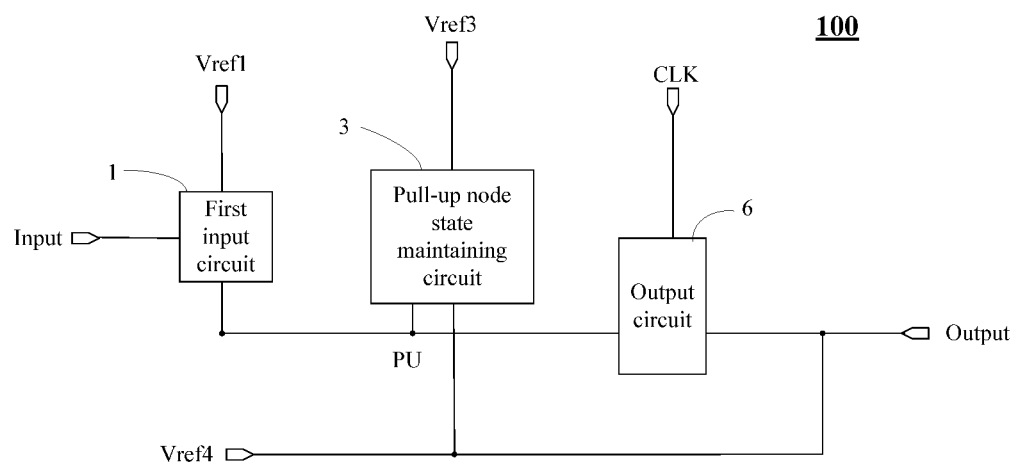
FIG. 1 shows a schematic block diagram of a shift register provided by an embodiment of the present disclosure.

FIG. 1 shows a schematic block diagram of a shift register provided by an embodiment of the present disclosure. As shown in FIG. 1, the shift register 100 comprises a first input circuit 1, a pull-up node state maintaining circuit 3 and an output circuit 6.

As shown in FIG. 1, a first terminal of the first input circuit 1 is connected to an input signal terminal Input, a second terminal of the first input circuit 1 is connected to a first reference signal terminal Vref1, and a third terminal of the first input circuit 1 is connected to a pull-up node PU, the first input circuit 1 is configured to supply a first reference signal of a first reference signal terminal Vref1 to the pull-up node PU under control of an input signal of the input signal terminal Input.

It should be noted that FIG. 1 only shows one possible implementation of the first input circuit 1. The first input circuit 1 may be configured as other forms according to the actual situation, for example, the first terminal and the second terminal of the first input circuit 1 are both connected to the input signal terminal Input, and pulls up the potential of the pull-up node PU under control of the input signal of the input signal terminal Input. Another example, the first input circuit 1 is configured to supply an input signal of the input signal terminal Input to the pull-up node PU under control of the first reference signal of the first reference signal terminal Vref1.

A first terminal of the pull-up node state maintaining circuit 3 is connected to a third reference signal terminal Vref3, a second terminal of the pull-up node state maintaining circuit 3 is connected to a fourth reference signal terminal Vref4, and a third terminal of the pull-up node state maintaining circuit 3 is connected to the pull-up node PU of the shift register 100.

The pull-up node state maintaining circuit 3 is configured to supply a third reference signal of the third reference signal terminal Vref3 to the pull-up node PU when the potential of the pull-up node PU is a first potential, and supply a fourth reference signal of the fourth reference signal terminal Vref4 to the pull-up node PU when the potential of the pull-up node PU is a second potential.

In some embodiments, the potentials of the first reference signal terminal Vref1 and the third reference signal terminal Vref3 are the first potential, and the potential of the fourth reference signal terminal Vref4 is the second potential.

A first terminal of the output circuit 6 is connected to the pull-up node PU, a second terminal of the output circuit 6 is connected to a first clock signal terminal CLK, and a third terminal of the output circuit 6 is connected to a gate signal output terminal Output of the shift register 100. The output circuit 6 is configured to output a first clock signal of the first clock signal terminal CLK to the gate signal output terminal Output under control of the potential of the pull-up node PU.

By means of adopting the shift register provided above by the embodiment of the present disclosure, since the pull-up node state maintaining circuit is set, the pull-up node state maintaining circuit is used to control the potential of the pull-up node, which can keep the potential of the pull-up node from attenuating with time, thereby ensuring stable output of the shift register.

It should be noted that the first potential and the second potential in the above embodiment of the present disclosure refer to a high potential or a low potential, instead of a specific voltage value, and their specific voltage values are not limited herein, as long as turn-on or turn-off of the transistors can be ensured. For example, when the first potential is a turn-on potential of the transistors used in the shift register 100, the second potential may be a turn-off potential of the transistors used in the shift register 100.

In some embodiments, in the shift register provided above by the embodiment of the present disclosure, since the pull-up node state maintaining circuit can maintain the potential of the pull-up node, that is, the pull-up node is maintained at a low potential when the pull-up node is at the turn-off potential (e.g., a low potential), the pull-up node is maintained at a high potential when the pull-up node is at a turn-on potential (e.g., a high potential), so that the potential of the pull-up node can be kept from attenuating, thus the above shift register can be applied to the H-Blank mode of Touch in cell touch screen (i.e. inserting the touch control period in the display period). During the touch control period, there is no output at the gate output terminal of the shift register unit, which avoids the influence caused by the gate enabling signal on the touch control signal and ensures the normal function of touch control. Moreover, since the pull-up node state maintaining circuit maintains the potential of the pull-up node, it is ensured that after the touch control ends, the circumstance of no output or too low output voltage will not appear in the shift register, and normal subsequent operations can be resumed.

Of course, the above shift register provided by the embodiment of the present disclosure is also applicable to the V-Blank mode of the Touch in cell touch screen (i.e., inserting the touch control period between two frames of display periods), in this case, the output terminal always remains at the potential of the last period after the previous frame ends and before the next frame starts, no affect is caused on the signal of the next frame.

Of course, the shift register provided above by the embodiment of the present disclosure is also applicable to the conventional gate driving mode (i.e., there is only the display period, no touch control period), which is not specifically limited herein.

The present disclosure will be described in detail below in conjunction with specific embodiments. It should be noted that the embodiments are intended to better explain the present disclosure, not to limit the present disclosure.

Figure 2:
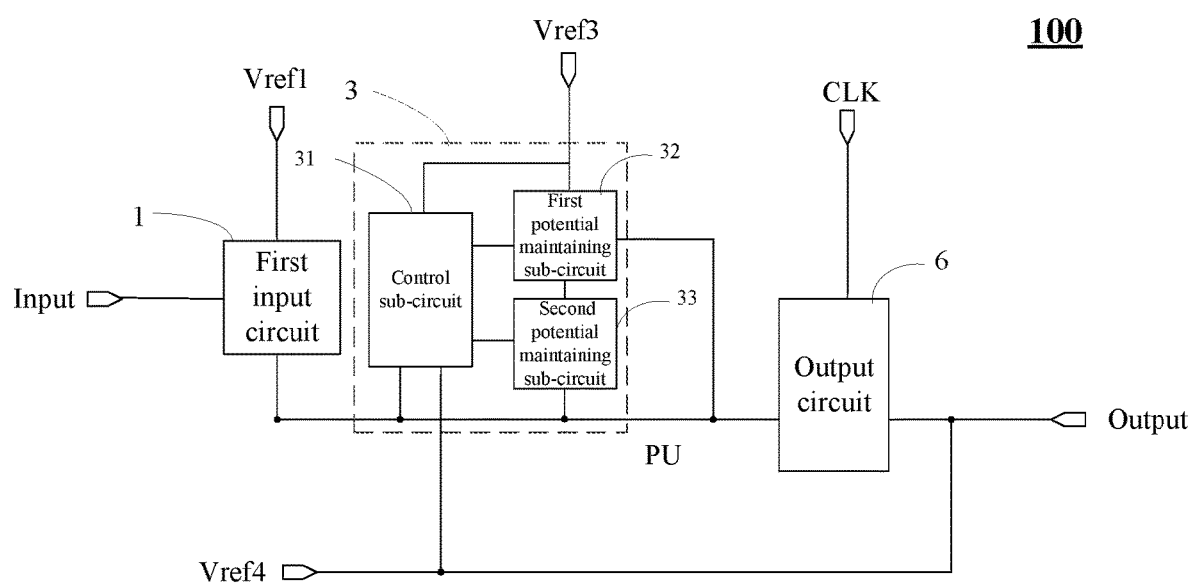
FIG. 2 shows a schematic block diagram of a shift register provided by an embodiment of the present disclosure.

FIG. 2 shows a schematic block diagram of a shift register provided by an embodiment of the present disclosure. As shown in FIG. 2, the shift register 100 may comprise a first input circuit 1, a pull-up node state maintaining circuit 3 and an output circuit 6. The first input circuit 1 and the output circuit 6 are the same as the first input circuit 1 and the output circuit 6 shown in FIG. 1, no more details repeated herein.

As shown in FIG. 2, the pull-up node state maintaining circuit 3 may further comprise a control sub-circuit 31, a first potential maintaining sub-circuit 32 and a second potential maintaining sub-circuit 33. A first terminal of the control sub-circuit 31 is connected to the third reference signal terminal Vref3, a second terminal of the control sub-circuit 31 is connected to the pull-up node PU, a third terminal of the control sub-circuit 31 is connected to the fourth reference signal terminal Vref4, and a fourth terminal of the control sub-circuit 31 is connected to a first terminal of the second potential maintaining sub-circuit 33. The control sub-circuit 31 is configured to output a control signal under control of the potential of the pull-up node PU and control turn-on and turn-off of the second potential maintaining sub-circuit 33.

A first terminal of the first potential maintaining sub-circuit 32 is connected to the third reference signal terminal Vref3, and a second terminal of the first potential maintaining sub-circuit 32 is connected to the pull-up node PU and the second potential maintaining sub-circuit 33. The first potential maintaining sub-circuit 32 is configured to input the third reference signal to the pull-up node PU according to the control signal. For example, when the second potential maintaining sub-circuit 33 is turned off under control of the control signal outputted from the control sub-circuit 31, the first potential maintaining sub-circuit 32 is configured to input the third reference signal to the pull-up node PU.

A first terminal of the second potential maintaining sub-circuit 33 is connected to the control sub-circuit 31, a second terminal of the second potential maintaining sub-circuit 33 is connected to the pull-up node PU, and a third terminal of the second potential maintaining sub-circuit 33 is connected to the fourth reference signal terminal Vref4. The second potential maintaining sub-circuit 33 is configured to input the fourth reference signal to the pull-up node PU according to the control signal. For example, when the second potential maintaining sub-circuit 33 is turned on under control of the control signal outputted from the control sub-circuit 31, the fourth reference signal is inputted to the pull-up node PU through the second potential maintaining sub-circuit 33.

Figure 3:
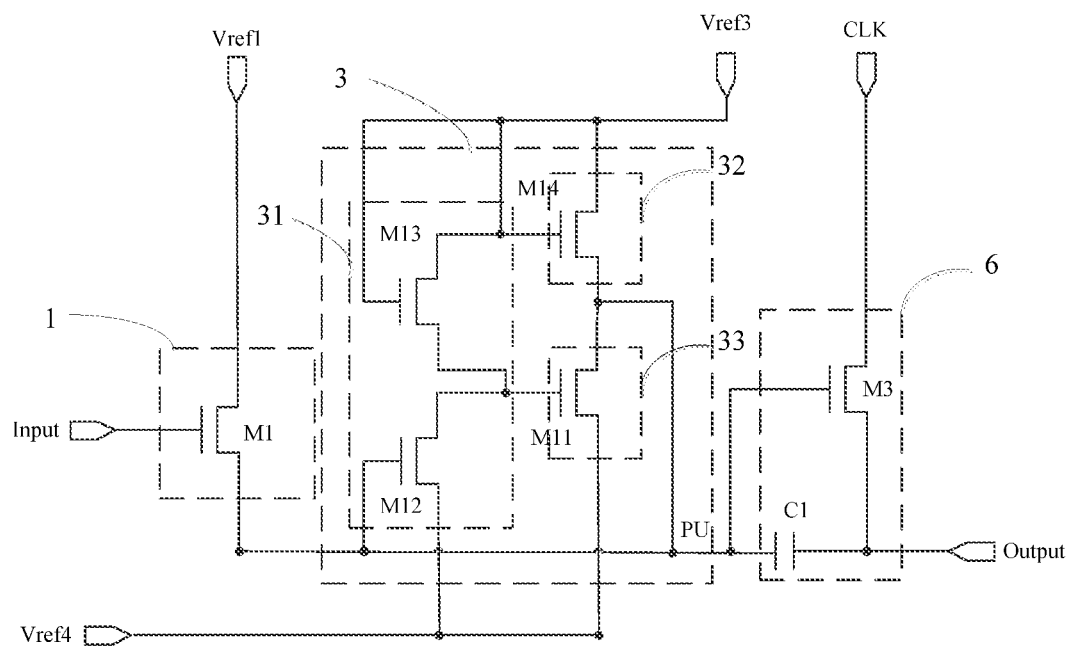
FIG. 3 shows a schematic diagram of circuit structure of a shift register according to an embodiment of the present disclosure.

FIG. 3 shows a schematic diagram of circuit structure of a shift register according to an embodiment of the present disclosure. The principle of the present disclosure will be described below by taking an example in which all transistors are N-type transistors. However, the person skilled in the art can understand that it is also possible that one or more transistors in the shift register adopt P-type transistor, as long as the position of the source and the drain and the corresponding voltage levels applied to the gate are adjusted accordingly. For example, all the transistors used in the embodiments of the present application are N-type transistors, the first potential is a high voltage level and the second potential is a low voltage level. If the N-type transistors are replaced with P-type transistors, the first potential is a low voltage level and the second potential is a high voltage level. No more details repeated herein, these should also be within the scope of the present disclosure.

As shown in FIG. 3, in an embodiment, the first input circuit 1 may comprise a first input transistor M1. A gate of the first input transistor M1 is connected to the input signal terminal Input, a first electrode of the first input transistor M1 is connected to the first reference signal terminal Vref1, and a second electrode of the first input transistor M1 is connected to the pull-up node PU. When the input signal terminal Input is inputted with an input signal of a high voltage level, the first input transistor M1 can be turned on under control of the input signal, and the signal of the first reference signal terminal is inputted to the pull-up node PU. The signal of the first reference signal terminal may be a turn-on signal of a high voltage level.

The above illustration is only a specific structure of the first input circuit 1 in the shift register, the structure of the first input circuit 1 is not limited to the above structure provided by the embodiment of the present disclosure, and may also be other structures known to the person skilled in the art, no limitation is made thereto. For example, the gate and the first electrode of the first input transistor M1 may be both connected to the input signal terminal Input. Another example, the gate of the first input transistor M1 may be connected to the first reference signal terminal Vref1, and the first electrode of the first input transistor M1 is connected to the input signal terminal Input.

In an embodiment, the control sub-circuit 31 may comprise a first control transistor M12 and a second control transistor M13. For example, a gate of the first control transistor M12 may be connected to the pull-up node PU, a first electrode of the first control transistor M12 may be connected to the fourth reference signal terminal Vref4, and a second electrode of the first control transistor M12 may be connected to the second potential maintaining sub-circuit 33 and a second electrode of the second control transistor M13. A gate of the second control transistor M13 may be connected to a first electrode of the second control transistor M13 and connected to the third reference signal terminal Vref3.

In an embodiment, the first potential maintaining sub-circuit 32 comprises a first potential maintaining transistor M14. A gate of the first potential maintaining transistor M14 is connected to a first electrode of the first potential maintaining transistor M14 and connected to the third reference signal terminal Vref3, and a second electrode of the first potential maintaining transistor M14 is connected to the pull-up node PU.

In an embodiment, the second potential maintaining sub-circuit 33 may comprise a second potential maintaining transistor M11. A gate of the second potential maintaining transistor M11 may be connected to the second electrode of the first control transistor M12, a first electrode of the second potential maintaining transistor M11 may be connected to the fourth reference signal terminal Vref4, and a second electrode of the second potential maintaining transistor M11 may be connected to the pull-up node PU.

The above illustration is merely specific structure of the control sub-circuit 31, the first potential maintaining sub-circuit 32 and the second potential maintaining sub-circuit 33 in the shift register. The specific structure of the control sub-circuit 31, the first potential maintaining sub-circuit 32 and the second potential maintaining sub-circuit 33 is not limited to the above-described structure provided by the embodiment of the present disclosure, and may also be other structures known to the person skilled in the art, no limitation is made thereto.

In some embodiments, when the pull-up node PU is at a turn-on potential (such as a high potential), the first control transistor M12 is turned on under control of the potential of the pull-up node PU. Since the potential of the third reference signal terminal is a high potential, the second control transistor M13 is also turned on under control of the third reference signal. In some embodiments, a channel width-to-length ratio of the first control transistor M12 and a channel width-to-length ratio of the second control transistor M13 may be set as that the channel width-to-length ratio of the first control transistor M12 is greater than the channel width-to-length ratio of the second control transistor M13, in this way, when the first control transistor M12 and the second control transistor M13 are both turned on, the fourth reference signal of the fourth reference signal terminal Vref4 is outputted to the second potential maintaining sub-circuit 33 as a control signal through the first control transistor M12. Herein, the potential of the fourth reference signal is a turn-off potential (such as a low potential). Thus the second potential maintaining transistor M11 is turned off under control of the fourth reference signal. At this time, since the gate of the first potential maintaining transistor M14 is connected to the third reference signal terminal Vref3, the first potential maintaining transistor M14 is turned on under control of the third reference signal, and the third reference signal inputted at the third reference signal terminal is supplied to the pull-up node PU, thereby maintaining the potential of the pull-up node PU at the high potential.

When the potential of the pull-up node PU is a low potential, the first control transistor M12 is turned off under control of the potential of the pull-up node PU. Since the potential of the third reference signal terminal Vref3 is at a high potential, the second control transistor M13 is turned on under control of the third reference signal, and the third reference signal is outputted to the second potential maintaining sub-circuit 33 as a control signal. Under control of the third reference signal, the second potential maintaining transistor M11 is turned on, a channel width-to-length ratio of the second potential maintaining transistor M11 and a channel width-to-length ratio of the first potential maintaining transistor M14 may be set as that the channel width-to-length ratio of the second potential maintaining transistor M11 is greater than the channel width-to-length ratio of the first potential maintaining transistor M14, in this way, when the first potential maintaining transistor M14 and the second potential maintaining transistor M11 are both turned on, the fourth reference signal is inputted to the pull-up node PU through the second potential maintaining transistor M11, and the pull-up node is discharged, thereby keeping the potential of the pull-up node always at a low potential.

In some embodiments, as shown in FIG. 3, the output circuit 6 may comprise an output transistor M3 and a first capacitor C1. For example, a gate of the output transistor M3 may be connected to the pull-up node PU, a first electrode of the output transistor M3 may be connected to the first clock signal terminal CLK, and a second electrode of the output transistor M3 may be connected to the gate signal output terminal Output of the shift register 100. A first terminal of the first capacitor C1 may be connected to the pull-up node PU, and a second terminal of the first capacitor C1 may be connected to the gate signal output terminal Output of the shift register 100.

When the first clock signal terminal CLK is inputted with the first clock signal of a high voltage level, since the output transistor M3 is turned on under control of the potential of the pull-up node PU, the output transistor M3 can input the first clock signal of a high voltage level to the gate signal output terminal Output and output a gate enabling signal at the gate signal output terminal Output. At this time, due to presence of the first capacitor C1, the potential of the pull-up node PU is further pulled up by the bootstrap function.

The above illustration is merely specific structure of the output circuit 6 in the shift register. The specific structure of the output circuit is not limited to the above-described structure provided by the embodiment of the present disclosure, and may also be other structures known to the person skilled in the art, no limitation is made thereto.

Figure 4:
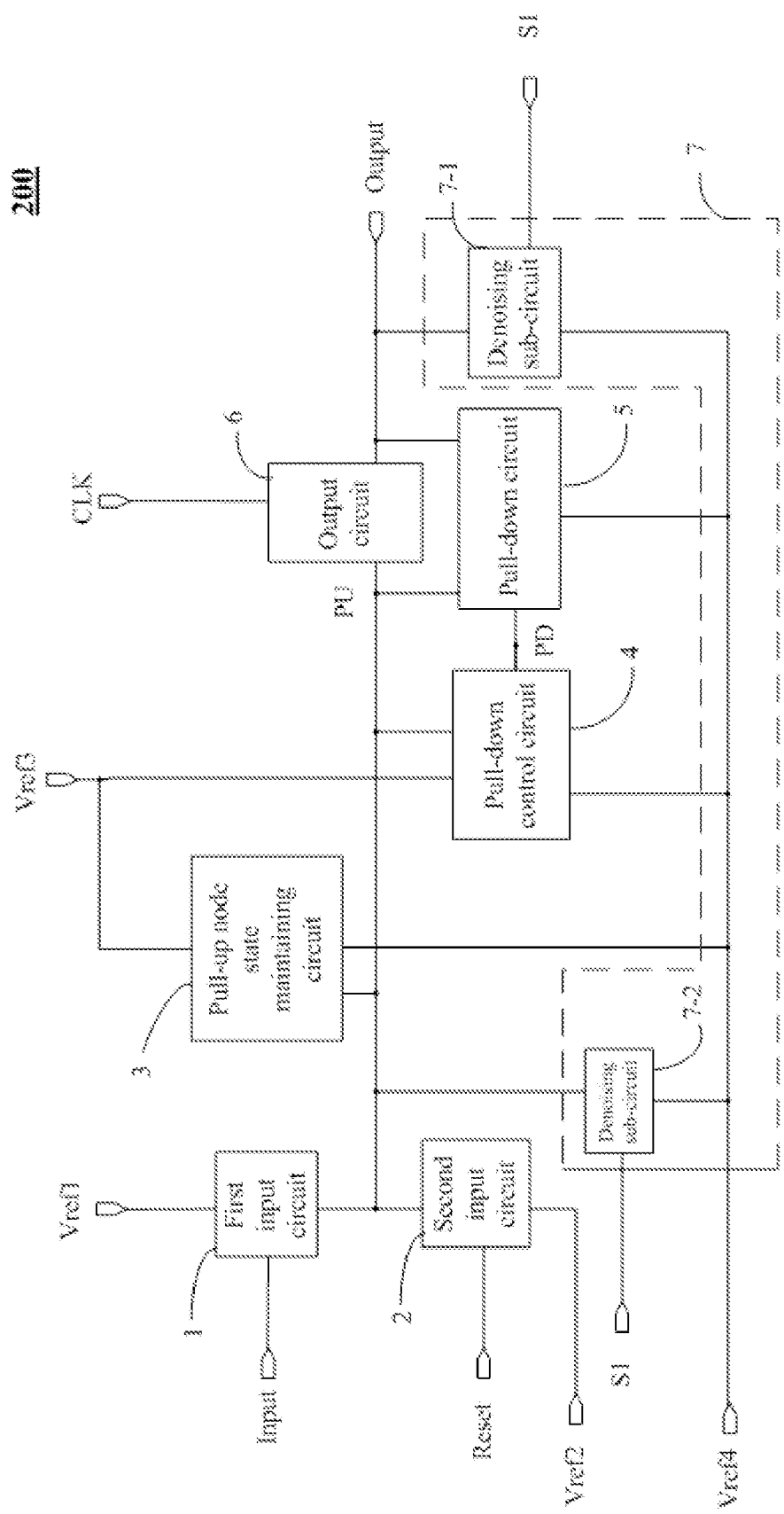
FIG. 4 shows a schematic block diagram of another shift register according to an embodiment of the present disclosure.

FIG. 4 shows a schematic block diagram of another shift register according to an embodiment of the present disclosure. As shown in FIG. 4, the shift register 200 may comprise a first input circuit 1, a second input circuit 2, a pull-up node state maintaining circuit 3, a pull-down control circuit 4, a pull-down circuit 5, an output circuit 6 and a denoising circuit 7. Herein, the first input circuit 1, the pull-up node state maintaining circuit 3 and the output circuit 6 shown in FIG. 4 may adopt the first input circuit 1, the pull-up node state maintaining circuit 3 and the output circuit described in FIGS. 1-3, no more details repeated below.

As shown in FIG. 4, a first terminal of the second input circuit 2 in the shift register 200 is connected to a reset signal terminal Reset, a second terminal of the second input circuit 2 is connected to a second reference signal terminal Vref2, a third terminal of the second input circuit 2 is connected to the pull-up node PU. In some embodiments, the second input circuit may be configured to supply a second reference signal of the second reference signal terminal Vref2 to the pull-up node PU under control of a reset signal of the reset signal terminal Reset. The potential of the signal inputted at the second reference signal terminal Vref2 is opposite to the potential of the signal inputted at the first reference signal terminal Vref1. For example, when the first reference signal terminal Vref1 is inputted with a signal of a high potential, the second reference signal terminal Vref2 is inputted with a signal of a low potential. When the first reference signal terminal Vref1 is inputted with a signal of a low potential, the second reference signal terminal Vref2 is inputted with a signal of a high potential.

The above illustration is merely specific structure of the second input circuit in the shift register. The structure of the second input circuit is not limited to the above-described structure provided by the embodiment of the present disclosure, and may also be other structures known to the person skilled in the art, no limitation is made thereto. Moreover, in the shift register provided above by the embodiment of the present disclosure, since the first input circuit and the second input circuit are symmetrically designed, the shift register can also implement the function of bidirectional scanning.

A first terminal of the pull-down control circuit 4 in the shift register 200 may be connected to the pull-up node PU, a second terminal of the pull-down control circuit 4 is connected to the third reference signal terminal Vref3, a third terminal of the pull-down control circuit 4 is connected to the fourth reference signal terminal Vref4, and a fourth terminal of the pull-down control circuit 4 is connected to a pull-down node PD of the shift register 200. In some embodiments, the pull-down control circuit 4 is configured to supply a signal of the fourth reference signal terminal Vref4 to the pull-down node PD when the pull-up node PU is at the first potential, and supply a signal of the third reference signal terminal Vref3 to the pull-down node PD when the pull-up node PU is at the second potential.

It should be noted that the first potential and the second potential in the above embodiments of the present disclosure refer to a high potential or a low potential, instead of a specific voltage value, and their specific voltage values are not limited herein, as long as turn-on or turn-off of the transistors can be ensured. For example, when the first potential is a turn-on potential of the transistors used in the shift register 200, the second potential may be a turn-off potential of the transistors used in the shift register 200.

A first terminal of the pull-down circuit 5 in the shift register 200 is connected to the pull-down node PD, a second terminal of the pull-down circuit 5 is connected to the pull-up node PU, a third terminal of the pull-down circuit 5 is connected to the gate signal output terminal Output of the shift register 200, and a fourth terminal of the pull-down circuit 5 is connected to the fourth reference signal terminal Vref4. In some embodiments, the pull-down circuit 5 is configured to supply a signal of the fourth reference signal terminal Vref4 to the pull-up node PU and the gate signal output terminal Output under control of the potential of the pull-down node PD.

A first terminal of the denoising circuit 7 in the shift register 200 may be connected to the gate signal output terminal Output, a second terminal of the denoising circuit 7 may be connected to the pull-up node PU, a third terminal of the denoising circuit 7 may be connected to the fourth reference signal terminal Vref4, and a fourth terminal of the denoising circuit 7 may be connected to a denoising signal terminal S1. In some embodiments, the denoising circuit 7 may be configured to supply a signal of the fourth reference signal terminal Vref4 to the gate signal output terminal Output and the pull-up node PU under control of a denoising signal of the denoising signal terminal S1.

As shown in FIG. 4, in some embodiments, the denoising circuit 7 may comprise a first denoising sub-circuit 7-1 and a second denoising sub-circuit 7-2.

A first terminal of the first denoising sub-circuit 7-1 may be connected to the gate signal output terminal Output, and a second terminal of the first denoising sub-circuit 7-1 may be connected to the denoising signal terminal S1, a third terminal of the first denoising circuit 7-1 may be connected to the fourth reference signal terminal Vref4. The first denoising sub-circuit 7-1 may be configured to supply a signal of the fourth reference signal terminal Vref4 to the gate signal output terminal Output under control of the denoising signal of the denoising signal terminal S1.

A first terminal of the second denoising sub-circuit 7-2 may be connected to the pull-up node PU, a second terminal of the second denoising sub-circuit 7-2 may be connected to the denoising signal terminal S1, and a third terminal of the second denoising sub-circuit 7-2 may be connected to the fourth reference signal terminal Vref4. The second denoising sub-circuit 7-2 is configured to supply a signal of the fourth reference signal terminal Vref4 to the pull-up node PU under control of the denoising signal of the denoising signal terminal S1.

Figure 5:
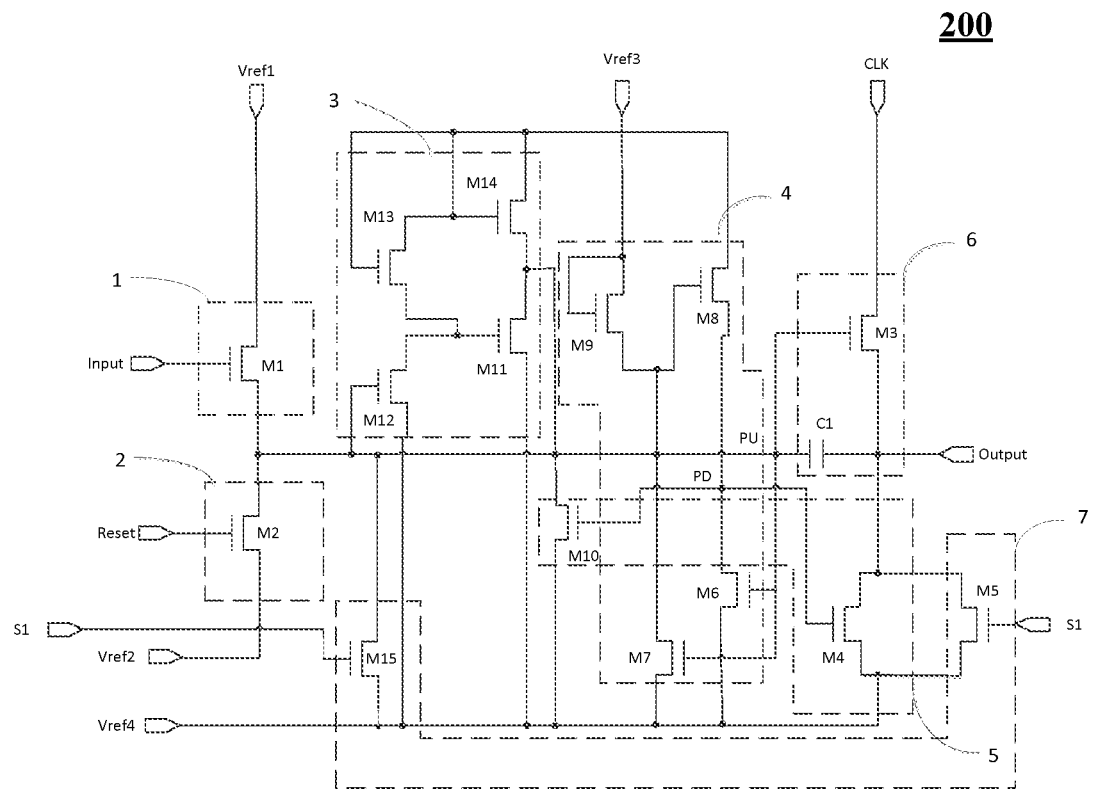
FIG. 5 shows a diagram of circuit structure of another shift register provided by an embodiment of the present disclosure.

FIG. 5 shows a diagram of circuit structure of another shift register provided by an embodiment of the present disclosure. As shown in FIG. 5, the shift register 200 may comprise a first input circuit 1, a second input circuit 2, a pull-up node state maintaining circuit 3, a pull-down control circuit 4, a pull-down circuit 5, an output circuit 6 and a denoising circuit 7. Herein, the first input circuit 1, the pull-up node state maintaining circuit 3, and the output circuit 6 shown in FIG. 5 may adopt the first input circuit 1, the pull-up node state maintaining circuit 3 and the output circuit 6 described in FIGS. 1-3, no more details repeated below.

In some embodiments, the second input circuit 2 may comprise a second input transistor M2. For example, a gate of the second input transistor M2 may be connected to the reset signal terminal Reset, a first electrode of the second input transistor M2 may be connected to the second reference signal terminal Vref2, and a second electrode of the second input transistor M2 may be connected to the pull-up node PU.

In some embodiments, the pull-down control circuit 4 may comprise a first pull-down control transistor M6, a second pull-down control transistor M7, a third pull-down control transistor M8 and a fourth pull-down control transistor M9. For example, a gate of the first pull-down control transistor M6 may be connected to the pull-up node PU, a first electrode of the first pull-down control transistor M6 may be connected to the fourth reference signal terminal Vref4, and a second electrode of the first pull-down control transistor M6 may be connected to the pull-down node PD.

A gate of the second pull-down control transistor M7 may be connected to the pull-up node PU, a first electrode of the second pull-down control transistor M7 may be connected to the fourth reference signal terminal Vref4, and a second electrode of the second pull-down control transistor M7 may be connected to a second electrode of the fourth pull-down control transistor M9 and a gate of the third pull-down control transistor M8.

The gate of the third pull-down control transistor M8 may be connected to the second electrode of the fourth pull-down control transistor M9 and the second electrode of the second pull-down control transistor M7 respectively, a first electrode of the third pull-down control transistor M8 may be connected to the third reference signal terminal Vref3, and a second electrode of the third pull-down control transistor M8 may be connected to the pull-down node PD.

A gate of the fourth pull-down control transistor M9 may be connected to a first electrode of the fourth pull-down control transistor M9 and connected to the third reference signal terminal Vref3, and the second electrode of the fourth pull-down control transistor M9 may be connected to the gate of the third pull-down control transistor M8 and connected to the second electrode of the second pull-down control transistor M7.

The above illustration is merely specific structure of the pull-down control circuit 4 in the shift register. The structure of the pull-down control circuit 4 is not limited to the above-described structure provided by the embodiment of the present disclosure, and may also be other structures known to the person skilled in the art, no limitation is made thereto.

In some embodiments, the pull-down circuit 5 may comprise a first pull-down transistor M4 and a second pull-down transistor M10. For example, a gate of the first pull-down transistor M4 may be connected to the pull-down node PD, a first electrode of the first pull-down transistor M4 may be connected to the fourth reference signal terminal Vref4, and a second electrode of the first pull-down transistor M4 may be connected to the gate signal output terminal Output.

A gate of the second pull-down transistor M10 may be connected to the pull-down node PD, a first electrode of the second pull-down transistor M10 may be connected to the fourth reference signal terminal Vref4, and a second electrode of the second pull-down transistor M10 may be connected to the pull-up node PU.

The above illustration is merely specific structure of the pull-down circuit 5 in the shift register. The structure of the pull-down circuit 5 is not limited to the above-described structure provided by the embodiment of the present disclosure, and may also be other structures known to the person skilled in the art, no limitation is made thereto.

In some embodiments, the denoising circuit 7 may comprise a first denoising transistor M5. For example, a gate of the first denoising transistor M5 may be connected to the denoising signal terminal S1, a first electrode of the first denoising transistor M5 may be connected to the fourth reference signal terminal Vref4, and a second electrode of the first denoising transistor M5 may be connected to the gate signal output terminal Output.

The denoising circuit 7 may further comprise a second denoising transistor M15. For example, a gate of the second denoising transistor M15 may be connected to the denoising signal terminal S1, a first electrode of the second denoising transistor M15 may be connected to the fourth reference signal terminal Vref4, and a second electrode of the second denoising transistor M15 may be connected to the pull-up node PU.

The above illustration is merely specific structure of the denoising circuit 7 in the shift register. The structure of the denoising circuit 7 is not limited to the above-described structure provided by the embodiment of the present disclosure, and may also be other structures known to the person skilled in the art, no limitation is made thereto.

In some embodiments, when the shift register provided by the embodiment of the present disclosure is applied to a gate driving circuit, the denoising signal terminal of the shift register at the first stage is connected to a separate signal terminal, that is, the denoising signal terminal of the shift register at the first stage is connected to the Dummy signal terminal, and the denoising signal terminal of the shift register at the other stages than the first stage may be connected to the frame start signal terminal, in this way, while the shift register at the first stage receives the frame start signal, the shift registers at the other stages than the first stage also receive the frame start signal, by which signal the shift registers at the other stages than the first stage are denoised.

In some embodiments, in the shift register provided by the embodiment of the present disclosure, in order to simplify the manufacturing process, the transistors usually adopt transistors made from the same material. Thus, all the transistors are N-type transistors, or all the transistors may be P-type transistors. In some embodiments, when the potential of a required gate enabling signal is a high potential, all the transistors are N-type transistors; or, when the potential of a required gate enabling signal is a low potential, all the transistors are P-type transistors.

Furthermore, in some embodiments, an N-type transistor is turned on under action of a high potential and is turned off under action of a low potential; a P-type transistor is turned off under action of a high potential and is turned on under action of a low potential.

It should be noted that each of the transistors referred to in the above embodiments of the present disclosure is a Metal Oxide Semiconductor (MOS). In specific implementations, the first electrode of these transistors is the source, the second electrode of these transistors is the drain, or the first electrode is the drain, and the second electrode is the source, no differentiation is made in detail herein.

Furthermore, in the above shift register provided by the embodiment of the present disclosure, the first input circuit 1 and the second input circuit 2 are designed symmetrically, which can effectuate function interchangeability. Therefore, the above-described shift register 200 provided by the embodiment of the present disclosure can implement the function of bidirectional scanning. During the forward scanning, the input signal terminal Input receives the input signal, the reset signal terminal Reset receives the reset signal, the first input circuit 1 functions as inputting, and the second input circuit 2 functions as resetting. During the reverse scanning, the input signal terminal Input receives the reset signal, the reset signal terminal Reset receives the input signal, the second input circuit 2 functions as inputting, and the first input circuit 1 functions as resetting.

In some embodiments, in the above shift register provided by the embodiment of the present disclosure, when the potential of a required gate enabling signal is a high potential, wherein during the forward scanning, the potential of the first reference signal terminal is a high potential, the third reference signal terminal is at a high potential, and the potentials of the second reference signal terminal and the fourth reference signal terminal are both a low potential. During the reverse scanning, the potentials of the second reference signal terminal and the third reference signal terminal are a high potential, and the potentials of the first reference signal terminal and the fourth reference signal terminal are both a low potential.

In some embodiments, in the above shift register provided by the embodiment of the present disclosure, when the potential of a required gate enabling signal is a low potential, wherein, during the forward scanning, potentials of the first reference signal terminal and the third reference signal terminal are a low potential, and potentials of the second reference signal terminal and the fourth reference signal terminal are both a high potential. During the reverse scanning, potentials of the second reference signal terminal and the third reference signal terminal are a low potential, and potentials of the first reference signal terminal and the fourth reference signal terminal are both a high potential.

Figure 6:
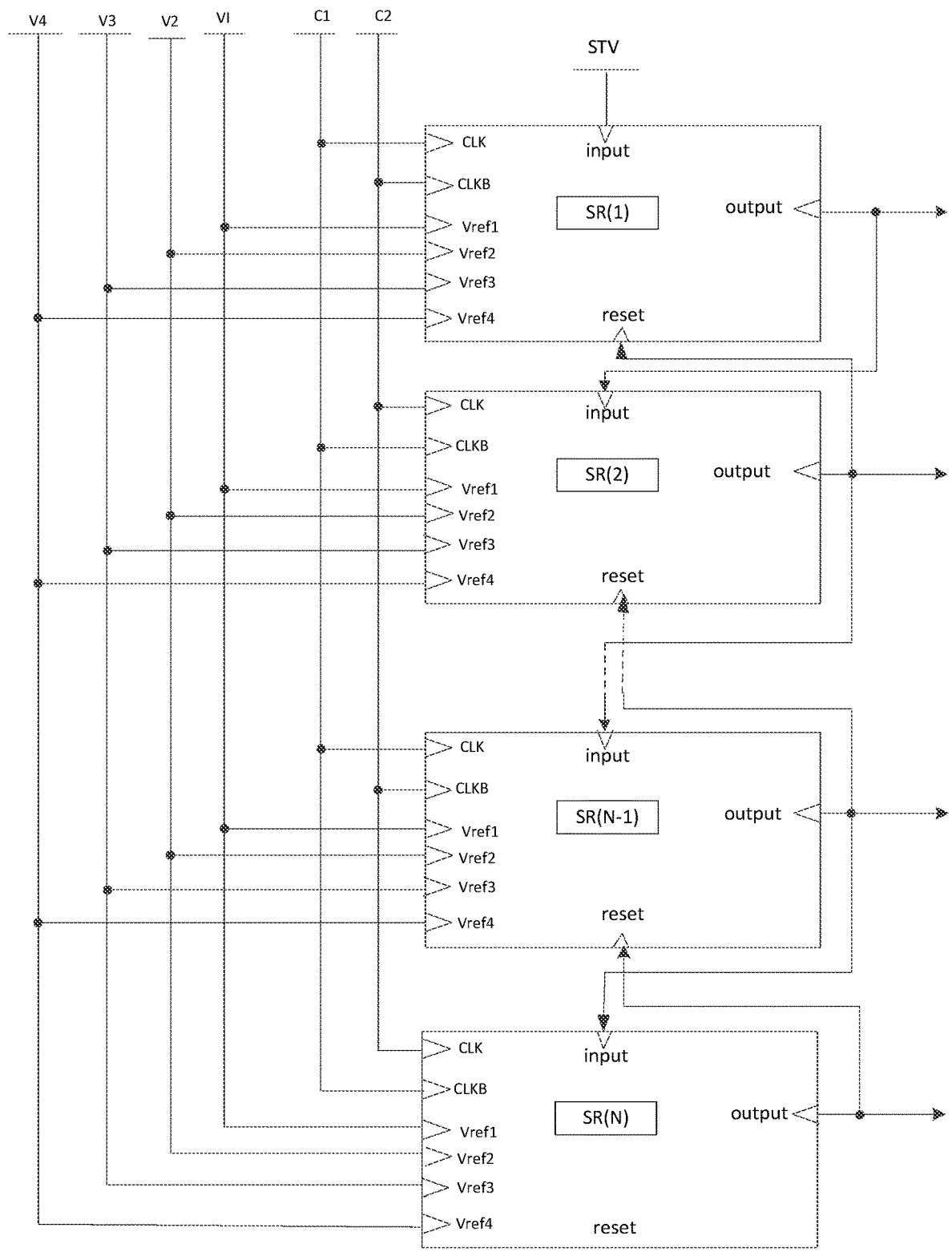
FIG. 6 shows a schematic diagram of a gate driving circuit provided by an embodiment of the present disclosure.

FIG. 6 shows a schematic diagram of a gate driving circuit provided by an embodiment of the present disclosure. As shown in FIG. 6, the gate driving circuit 600 comprises a plurality of any of the shift register provided above by the embodiment of the present disclosure that are cascaded together: SR(1), SR(2) * * * SR(n) * * * SR(N−1), SR(N) (N shift registers in total, 1≤n≤N), Except the shift register SR(1) at the first stage, the signal output terminal Output of the shift register SR(n) at each of the rest stages is respectively connected to the reset signal terminal Reset of the shift register SR(n−1) at the adjacent previous stage.

Except the shift register SR(N) at the last stage, the signal output terminal Output of the shift register SR(n) at each of the rest stages is respectively connected to the input signal terminal Input of the shift register SR(n+1) at the adjacent next stage.

In an example, the input signal terminal Input of the shift register SR(1) at the first stage is connected to the frame start signal terminal STV.

In an example, in the gate driving circuit 600 provided by the embodiment of the present disclosure, the first reference signal terminals Vref1 of all the shift registers are connected to the first reference signal line V1, and the second reference signal terminals Vref2 of all the shift registers are connected to the second reference signal line V2, and the third reference signal terminals Vref3 of all the shift registers are connected to the third reference signal line V3, and the fourth reference signal terminals Vref4 of all the shift registers are connected to the fourth reference signal line V4. The first clock signal terminals CLK of all odd-numbered shift registers are connected to the first clock signal line C1, and the second clock signal terminals CLKB of all odd-numbered shift registers are connected to the second clock signal line C2. The first clock signal terminals CLK of all the even-numbered shift registers are connected to the second clock signal line C2, and the second clock signal terminals CLKB of all the even-numbered shift registers are connected to the first clock signal line C1, and the clock signal on the first clock signal line C1 is opposite in phase to the clock signal on the second signal line C2.

Figure 7:
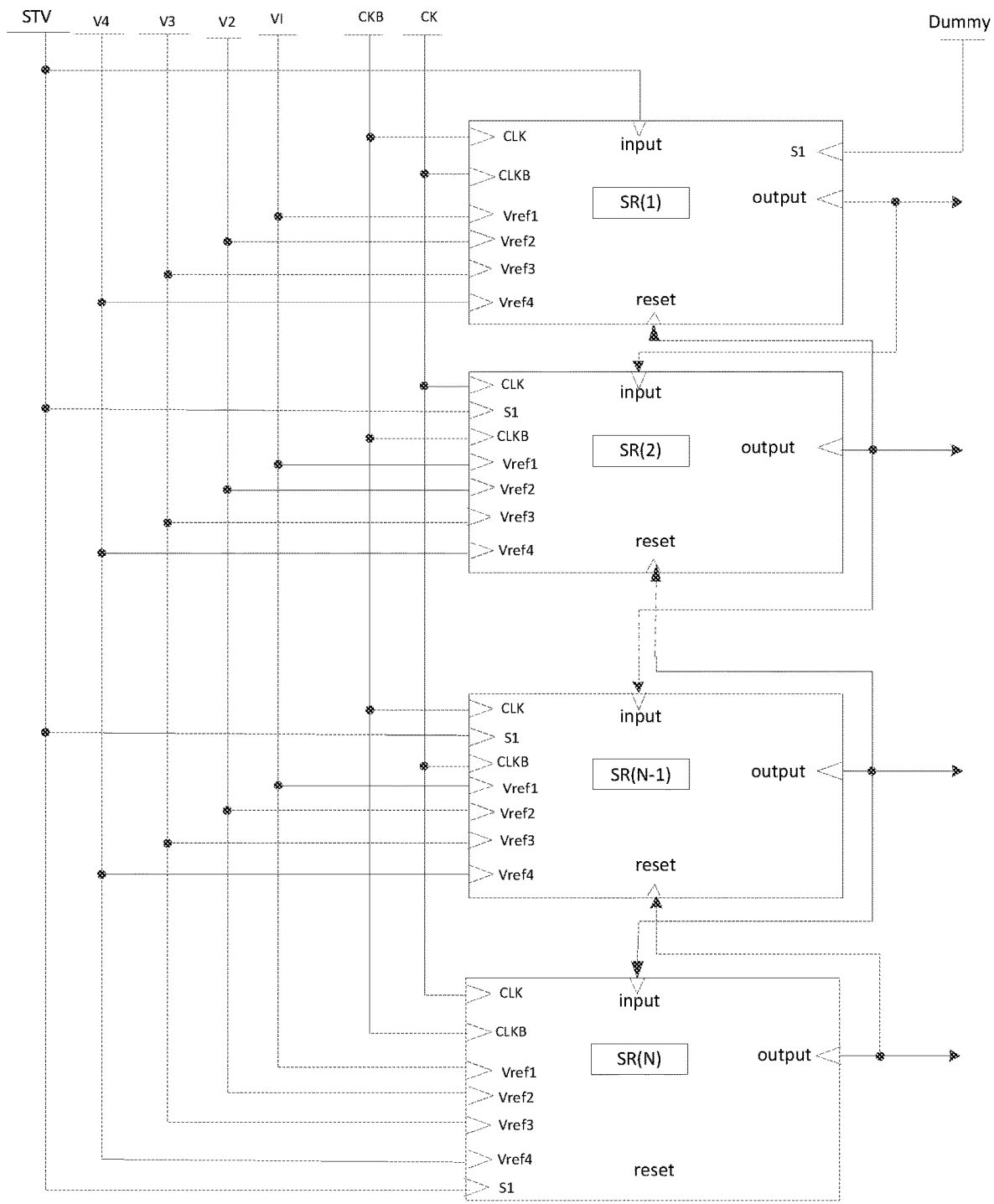
FIG. 7 shows a schematic diagram of another gate driving circuit provided by an embodiment of the present disclosure.

FIG. 7 shows a schematic diagram of another gate driving circuit provided by an embodiment of the present disclosure. As shown in FIG. 7, when the shift register in the gate driving circuit comprises a denoising circuit, except the shift register SR(1) at the first stage, the denoising signal terminals S1 of the shift registers SR(2) to SR(N) at all the other stages are all connected to the frame start signal terminal STV. The denoising signal terminal S1 of the shift register SR(1) at the first stage is connected to a separate signal terminal, that is, the denoising signal terminal S1 of the shift register SR(1) at the first stage is connected to the Dummy signal terminal, in this way, while the shift register SR(1) at the first stage receives the frame start signal, the shift registers SR(2) to SR(N) at the other stages than the shift register SR(1) at the first stage also receive the frame start signal, by which signal the shift registers SR(2) to SR(N) at the other stages than the shift register SR(1) at the first stage are denoised.

At least one embodiment of the present disclosure further provides a display device, comprising the gate driving circuit described above, wherein scanning signals are provided by this gate driving circuit to respective gate lines on an array substrate in the display device. The display device may be mobile phone, tablet computer, television, monitor, laptop, digital photo frame, navigator and any other products or components having a display function. For implementations of the display device, reference may be made to the embodiments of the gate driving circuit described above, and the repeated description is omitted.

By means of adopting the shift register, the gate driving circuit and the display device provided by the embodiments of the present disclosure, since the pull-up node state maintaining circuit is set, the pull-up node state maintaining circuit can be used to maintain the potential of the pull-up node during the touch control period, which can keep the potential of the pull-up node from attenuating with time, thereby ensuring stable output of the shift register.

Figure 8:
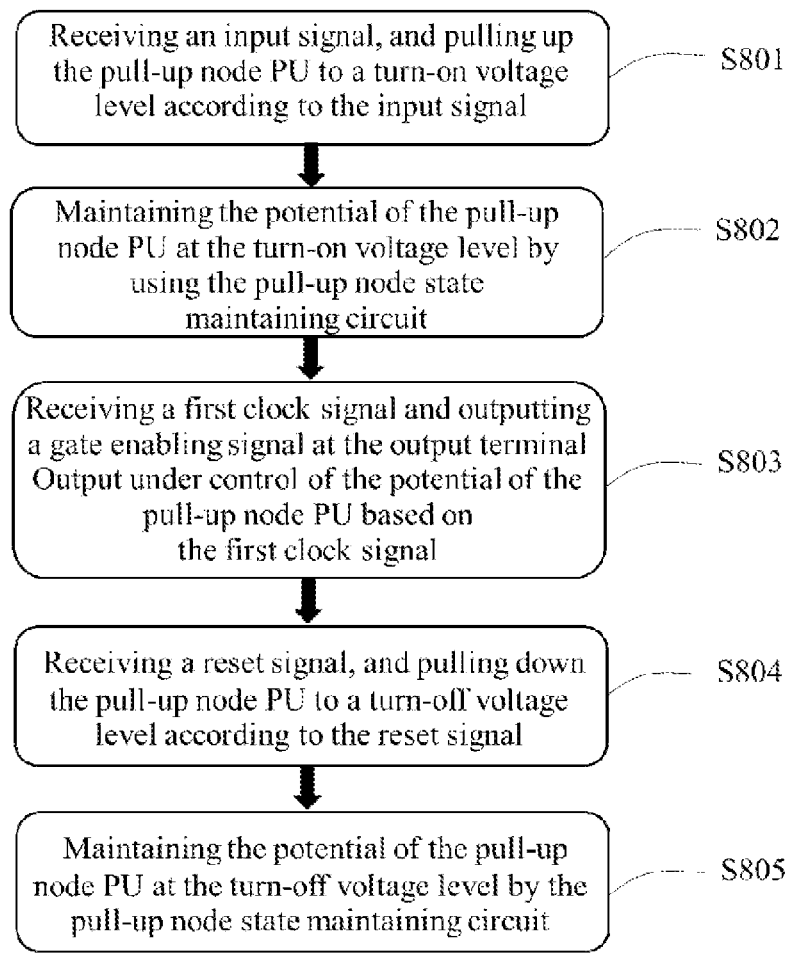
FIG. 8 shows a flowchart of a driving method of a shift register according to an embodiment of the present disclosure.

FIG. 8 shows a flowchart of a driving method of a shift register according to an embodiment of the present disclosure. As shown in FIG. 8, the driving method 800 may comprise the following steps:

Step S801, receiving an input signal, and pulling up the pull-up node PU to a turn-on voltage level according to the input signal.

Step S802, maintaining the potential of the pull-up node PU at the turn-on voltage level by using the pull-up node state maintaining circuit.

Step S803, receiving a first clock signal and outputting a gate enabling signal at the output terminal Output under control of the potential of the pull-up node PU based on the first clock signal.

Step S804, receiving a reset signal, and pulling down the pull-up node PU to a turn-off voltage level according to the reset signal.

Step S805, maintaining the potential of the pull-up node PU at the turn-off voltage level by the pull-up node state maintaining circuit.

Hereinafter, an operating process of the shift register provided above by the embodiment of the present disclosure will be explained in combination with circuit timing diagrams and with the forward scanning as an example. In the following description, 1 represents a turn-on potential of the transistor, such as a high potential signal, 0 represents a turn-off potential of the transistor, such as a low potential signal.

Figure 9:
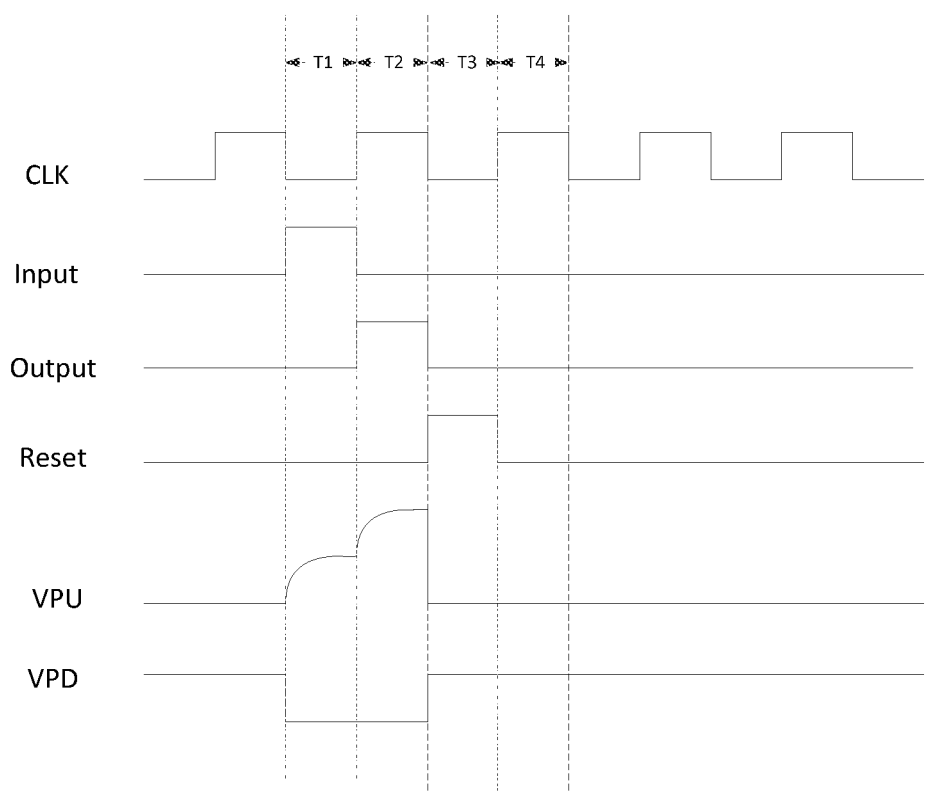
FIG. 9 shows an exemplary timing diagram of a shift register according to an embodiment of the present disclosure.

FIG. 9 shows an exemplary timing diagram of a shift register according to an embodiment of the present disclosure. The driving timing shown in FIG. 9 may be applied to any of the shift register described above.

Taking the shift register shown in FIG. 5 as an example, the transistors in the shift register shown in FIG. 5 are all N-type transistors, the first reference signal terminal Vref1 and the third reference signal terminal Vref3 are both a high potential, and the second reference signal terminal Vref2 and the fourth reference signal terminal Vref4 are both a low potential.

In the period T1, Input=1, Reset=0, CLK=0.

The signal of the input signal terminal Input is a signal of a high voltage level, that is, the output signal of the previous stage, thus enabling the first input transistor M1 to be turned on, and the first reference signal sent by the first reference signal terminal Vref1 charges the capacitor C1 through the first input transistor M1, so as to pull up the potential of the pull-up node PU. Since the pull-up node PU is at a high voltage level, the first pull-down control transistor M6 and the second pull-down control transistor M7 are turned on, turn-on of the second pull-down control transistor M7 supplies the fourth reference signal of the fourth reference signal terminal Vref4 to the gate of the third pull-down control transistor M8 and the second electrode of the fourth pull-down control transistor M9 respectively, turn-on of the first pull-down control transistor M6 supplies the fourth reference signal of the fourth reference signal terminal Vref4 to the pull-down node PD, thus pulling down the potential of the node PD, so that the first pull-down transistor M4 and the second pull-down transistor M10 are turned off, thereby ensuring stability of the signal outputted by the signal output terminal Output.

In this case, the potential of the pull-up node PU is a high potential, the first control transistor M12 is turned on, since the potential of the third reference signal terminal Vref3 is a high potential, the second control transistor M13 and the first potential maintaining transistor M14 are both turned on, wherein the channel width-to-length ratio of the first control transistor M12 is greater than the channel width-to-length ratio of the second control transistor M13, and the source of the first control transistor M12 is connected to the fourth reference signal terminal Vref4, wherein the fourth reference signal terminal Vref4 is at a low potential, thus the second potential maintaining transistor M11 is turned off, since the first potential maintaining transistor M14 is turned on, the third reference signal sent from the third reference signal terminal Vref3 is continuously supplied to the pull-up node PU, thus maintaining the potential of the pull-up node PU at a high potential, causing the pull-up node PU to form a high voltage level with memorability.

In the period T2, Input=0, Reset=0, CLK=1.

The signal of the input signal terminal Input is a signal of a low voltage level, thus enabling the first input transistor M1 to be turned off, the pull-up node PU continues to maintain the high voltage level of the previous stage, and the output transistor M3 remains turned on, in this case, the first clock signal sent by the first clock signal terminal CLK is a high voltage level signal, and the potential of the pull-up node PU is raised due to the bootstrap effect of the first capacitor C1, and the first clock signal is outputted to the signal output terminal Output, at this moment, the potential of the pull-up node PU is a high potential, the first pull-down control transistor M6 and the second pull-down control transistor M7 are still in a turn-on state, so that the first pull-down transistor M4 and the second pull-down transistor M10 remain in a turn-off state, thereby ensuring stability of the output signal of the signal output terminal Output.

In the period T3, Input=0, Reset=1, CLK=0.

The signal of the reset signal terminal Reset is a high voltage level signal, that is, the output signal of the next stage, thus enabling the second input transistor M2 to be turned on, and the second reference signal sent by the second reference signal terminal Vref2 is supplied to the pull-up node PU through the second input transistor M2 that is turned on, such that the output transistor M3, the first pull-down control transistor M6 and the second pull-down control transistor M7 are in a turn-off state, since the third reference signal terminal Vref3 is at a high potential, the third pull-down control transistor M8 and the fourth pull-down control transistor M9 are turned on, so that the pull-down node PD is at a high potential, thus the first pull-down transistor M4 and the second pull-down transistor M10 are turned on, and the signal of the fourth reference signal terminal Vref4 is supplied to the pull-up node PU and the signal output terminal Output, wherein the signal of the fourth reference signal terminal Vref4 at this moment is a low voltage level signal.

Since the potential of the pull-up node PU is a low potential, the first control transistor M12 is turned off, since the third reference signal terminal Vref3 is at a high potential, the second control transistor M13 and the first potential maintaining transistor M14 are both turned on, wherein the channel width-to-length ratio of the second potential maintaining transistor M11 is larger than the channel width-to-length ratio of the first potential maintaining transistor M14, the second potential maintaining transistor M11 supplies the signal of the fourth reference signal terminal Vref4 to the pull-up node PU, the pull-up node PU is discharged, thereby maintaining the potential of the pull-up node PU at a low potential, and causing the pull-up node PU to form a low voltage level with memorability.

In the period T4, Input=0, Reset=0, CLK=1.

This period is the no-output period, the first input transistor M1 is always in the turn-off state, since the potential of the third reference signal terminal Vref3 is a high potential, the third pull-down control transistor M8 and the fourth pull-down control transistor M9 are turned on, so that the pull-down node PD is maintained at the high potential, the first pull-down transistor M4 and the second pull-down transistor M10 are turned on, and the pull-up node PU is continuously denoised, so that a noise voltage generated by the first clock signal terminal CLK is eliminated, thereby achieving low voltage output and ensuring stability of the signal outputted at the signal output terminal Output.

After the period T4, before arrival of the signal of the next frame, the shift register repeats the period T4, and the shift register is continuously denoised. Moreover, after ending of the previous frame and before arrival of the next frame, the denoising signal terminal S1 is at a high voltage level, and the first denoising transistor M5 is turned on to perform denoising on the signal output terminal Output.

The embodiment described above is applicable to the conventional GOA mode. Of course, it is also applicable to the V-Blank mode of Touch in cell. The specific application is not limited herein.

Figure 10:
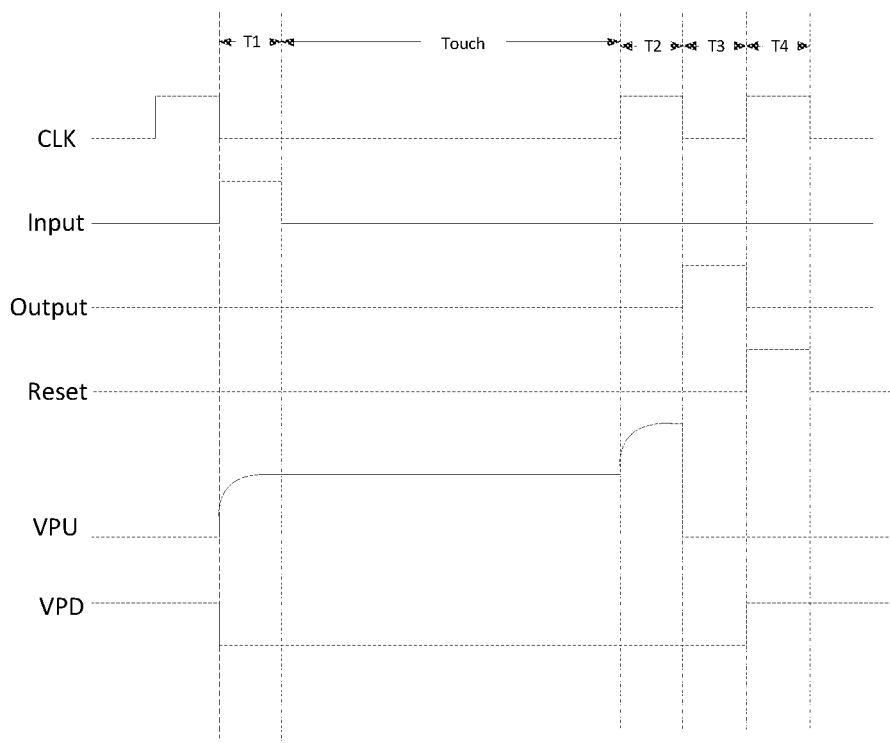
FIG. 10 shows another exemplary timing diagram of a shift register according to an embodiment of the present disclosure.

FIG. 10 shows another exemplary timing diagram of a shift register according to an embodiment of the present disclosure.

Taking the shift register shown in FIG. 5 as an example, wherein the transistors in the shift register shown in FIG. 5 are all N-type transistors, the first reference signal terminal Vref1 and the third reference signal terminal Vref3 are both high potentials, and the second reference signal terminal Vref2 and the fourth reference signal terminal Vref4 are both low potentials, and a corresponding input/output timing diagram is shown in FIG. 10.

The shift register provided in this embodiment is also applicable to the H-Blank mode of Touch in cell touch screen (that is, the touch control period is inserted in the display period), and description is provided with the touch control signal being inserted between the period T1 and the period T2 as an example.

After the period T1, when there is a touch control signal coming, since the potential of the pull-up node PU is maintained at high through the second potential maintaining transistor M11, the first control transistor M12, the second control transistor M13 and the first potential maintaining transistor M14 at this time, that is, the potential of the pull-up node PU is maintained by the pull-up node state maintaining circuit 3, potential drop of the pull-up node PU is avoided, thereby ensuring stable output of the shift register at the next stage, in this case, the first clock signal sent by the signal terminal CLK is a low voltage level signal, and the shift register has no output, which avoids the interference caused by the output of the shift register to the touch control signal, thereby ensuring the touch control function. Meanwhile, since the pull-up node PU of the other rows is at a low voltage level, the pull-up node state maintaining circuit 3 performs low-level maintaining, so the subsequent operation of the other rows is not affected, and after the ending of the touch control period, the operation of the period T2 is continued.

Figure 11:
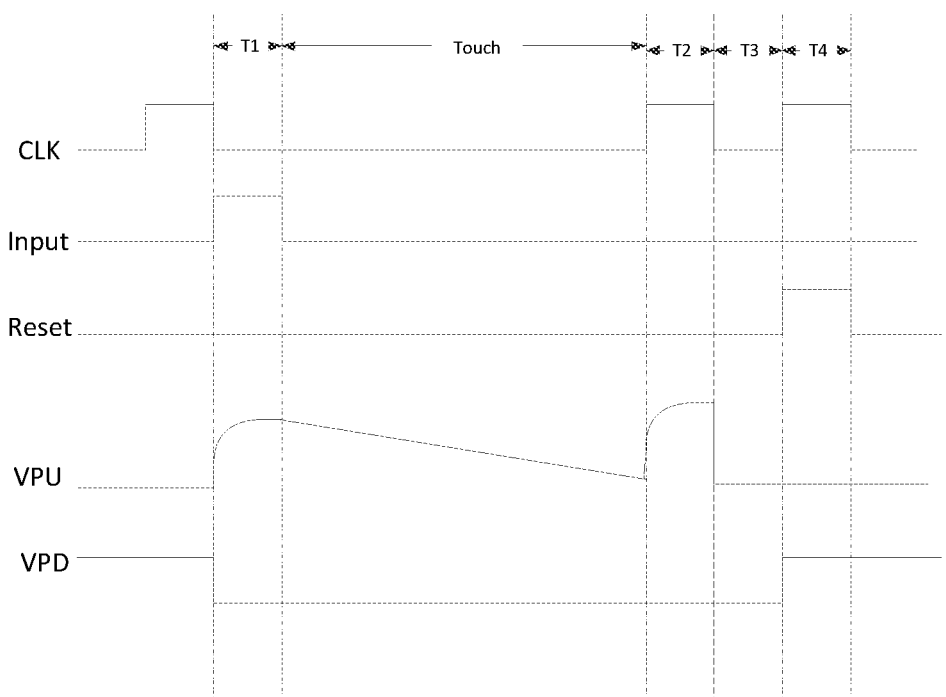
FIG. 11 shows a timing diagram of a shift register according to the prior art.

If there is no pull-up node state maintaining circuit 3 that maintains the potential of the pull-up node PU, since the second input transistor M2 and the second pull-down transistor M10 may have a leakage phenomenon, so that the potential of the pull-up node PU is pulled down, in this way, after the touch control period ends, the shift register will have the problem of having no output or the output voltage is too low. The specific timing diagram is shown in FIG. 11.

It should be noted that the touch control period may be located between any of the four periods in the embodiments, and the foregoing is only an example between the period T1 and the period T2, and the working principle is the same when it is between the other periods, no details repeated herein.

When the above shift register is applied to the H-Blank mode of the Touch in cell touch screen, the operating process of each period of the shift register is the same as that of the respective periods in the embodiment, no details repeated herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The above is illustration of the present disclosure and should not be construed as making limitation thereto. Although some exemplary embodiments of the present disclosure have been described, the person skilled in the art can easily understand that many modifications may be made to these exemplary embodiments without departing from the creative teaching and advantages of the present disclosure. Therefore, all such modifications are intended to be included within the scope of the present disclosure as defined by the appended claims. As will be appreciated, the above is to explain the present disclosure, it should not be constructed as limited to the specific embodiments disclosed, and modifications to the present disclosure and other embodiments are included in the scope of the attached claims. The present disclosure is defined by the claims and their equivalents.

What is claimed is:

1. A shift register, comprising:
    a first input circuit configured to input an input signal to a pull-up node;
    a pull-up node state maintaining circuit, a first terminal of the pull-up node state maintaining circuit being connected to a third reference signal terminal, a second terminal of the pull-up node state maintaining circuit being connected to a fourth reference signal terminal, and a third terminal of the pull-up node state maintaining circuit being connected to the pull-up node, and the pull-up node state maintaining circuit being configured to supply a third reference signal of the third reference signal terminal to the pull-up node when the potential of the pull-up node is a first potential, the third reference signal being used to maintain the potential of the pull-up node at the first potential, and supply a fourth reference signal of the fourth reference signal terminal to the pull-up node when the potential of the pull-up node is a second potential, the fourth reference signal being used to maintain the potential of the pull-up node at the second potential; and
    an output circuit configured to output a gate enabling signal at a gate signal output terminal under control of the potential of the pull-up node.

2. The shift register of claim 1, wherein the pull-up node state maintaining circuit comprises a control sub-circuit, a first potential maintaining sub-circuit and a second potential maintaining sub-circuit,
    a first terminal of the control sub-circuit is connected to the third reference signal terminal, a second terminal of the control sub-circuit is connected to the pull-up node, a third terminal of the control sub-circuit is connected to the fourth reference signal terminal, and a fourth terminal of the control sub-circuit is connected to a first terminal of the second potential maintaining sub-circuit, the control sub-circuit is configured to output a control signal under control of the potential of the pull-up node and control turn-on and turn-off of the second potential maintaining sub-circuit;
    a first terminal of the first potential maintaining sub-circuit is connected to the third reference signal terminal, and a second terminal of the first potential maintaining sub-circuit is connected to the pull-up node and the second potential maintaining sub-circuit, the first potential maintaining sub-circuit is configured to input the third reference signal to the pull-up node when the second potential maintaining sub-circuit is turned off; and the first terminal of the second potential maintaining sub-circuit is connected to the control sub-circuit, a second terminal of the second potential maintaining sub-circuit is connected to the pull-up node, and a third terminal of the second potential maintaining sub-circuit is connected to the fourth reference signal terminal, the second potential maintaining sub-circuit is configured to input the fourth reference signal to the pull-up node when the second potential maintaining sub-circuit is turned on under the control of the control signal.

3. The shift register of claim 2, wherein the control sub-circuit comprises a first control transistor and a second control transistor, a gate of the first control transistor is connected to the pull-up node, a first electrode of the first control transistor is connected to the fourth reference signal terminal, and a second electrode of the first control transistor is connected to the second potential maintaining sub-circuit and a second electrode of the second control transistor;

a gate of the second control transistor is connected to a first electrode of the second control transistor and connected to the third reference signal terminal.

4. The shift register of claim 2, wherein the first potential maintaining sub-circuit comprises a first potential maintaining transistor, a gate of the first potential maintaining transistor is connected to a first electrode of the first potential maintaining transistor and connected to the third reference signal terminal, and a second electrode of the first potential maintaining transistor is connected to the pull-up node.

5. The shift register of claim 2, wherein the second potential maintaining sub-circuit comprises a second potential maintaining transistor, a gate of the second potential maintaining transistor is connected to the second electrode of the first control transistor, a first electrode of the second potential maintaining transistor is connected to the fourth reference signal terminal, and a second electrode of the second potential maintaining transistor is connected to the pull-up node.

6. The shift register of claim 3, wherein a channel width-to-length ratio of the first control transistor is greater than a channel width-to-length ratio of the second control transistor.

7. The shift register of claim 5, wherein a channel width-to-length ratio of the second potential maintaining transistor is greater than a channel width-to-length ratio of the first potential maintaining transistor.

8. The shift register of claim 1, wherein the first input circuit comprises a first input transistor, a gate of the first input transistor is connected to an input signal terminal, a first electrode of the first input transistor is connected to a first reference signal terminal, and a second electrode of the first input transistor is connected to the pull-up node.

9. The shift register of claim 1, further comprising: a second input circuit, a first terminal of the second input circuit being connected to a reset signal terminal, a second terminal of the second input circuit being connected to a second reference signal terminal, a third terminal of the second input circuit being connected to the pull-up node, wherein the second input circuit is configured to supply a signal of the second reference signal terminal to the pull-up node under control of a reset signal of the reset signal terminal.

10. The shift register of claim 9, wherein the second input circuit comprises a second input transistor, a gate of the second input transistor is connected to the reset signal terminal, a first electrode of the second input transistor is connected to the second reference signal terminal, and a second electrode of the second input transistor is connected to the pull-up node.

11. The shift register of claim 1, further comprising: a pull-down control circuit, a first terminal of the pull-down control circuit being connected to the pull-up node, a second terminal of the pull-down control circuit being connected to the third reference signal terminal, a third terminal of the pull-down control circuit being connected to the fourth reference signal terminal, and a fourth terminal of the pull-down control circuit being connected to a pull-down node of the shift register, wherein the pull-down control circuit is configured to supply a signal of the fourth reference signal terminal to the pull-down node when the pull-up node is at the first potential, and supply a signal of the third reference signal terminal to the pull-down node when the pull-up node is at the second potential.

12. The shift register of claim 11, wherein the pull-down control circuit comprises: a first pull-down control transistor, a second pull-down control transistor, a third pull-down control transistor and a fourth pull-down control transistor;

a gate of the first pull-down control transistor is connected to the pull-up node, a first electrode of the first pull-down control transistor is connected to the fourth reference signal terminal, and a second electrode of the first pull-down control transistor is connected to the pull-down node;

a gate of the second pull-down control transistor is connected to the pull-up node, a first electrode of the second pull-down control transistor is connected to the fourth reference signal terminal, and a second electrode of the second pull-down control transistor is connected to a gate of the third pull-down control transistor and a second electrode of the fourth pull-down control transistor respectively;

the gate of the third pull-down control transistor is connected to the second electrode of the fourth pull-down control transistor and the second electrode of the second pull-down control transistor respectively, a first electrode of the third pull-down control transistor is connected to the third reference signal terminal, and a second electrode of the third pull-down control transistor is connected to the pull-down node;

a gate of the fourth pull-down control transistor is connected to a first electrode of the fourth pull-down control transistor and connected to the third reference signal terminal, and the second electrode of the fourth pull-down control transistor is connected to the gate of the third pull-down control transistor and the second electrode of the second pull-down control transistor.

13. The shift register of claim 1, further comprising: a pull-down circuit, a first terminal of the pull-down circuit being connected to the pull-down node, a second terminal of the pull-down circuit being connected to the pull-up node, a third terminal of the pull-down circuit being connected to the gate signal output terminal, and a fourth terminal of the pull-down circuit being connected to the fourth reference signal terminal, wherein the pull-down circuit is configured to supply a signal of the fourth reference signal terminal to the pull-up node and the gate signal output terminal under control of the potential of the pull-down node.

14. The shift register of claim 13, wherein the pull-down circuit comprises: a first pull-down transistor and a second pull-down transistor;
- a gate of the first pull-down transistor is connected to the pull-down node, a first electrode of the first pull-down transistor is connected to the fourth reference signal terminal, and a second electrode of the first pull-down transistor is connected to the gate signal output terminal;
- a gate of the second pull-down transistor is connected to the pull-down node, a first electrode of the second pull-down transistor is connected to the fourth reference signal terminal, and a second electrode of the second pull-down transistor is connected to the pull-up node.

15. The shift register of claim 1, wherein the output circuit comprises: an output transistor and a first capacitor;
- a gate of the output transistor is connected to the pull-up node, a first electrode of the output transistor is connected to a first clock signal terminal, and a second electrode of the output transistor is connected to the gate signal output terminal;
- a first terminal of the first capacitor is connected to the pull-up node, and a second terminal of the first capacitor is connected to the gate signal output terminal.

16. The shift register of claim 1, further comprising: a denoising circuit, wherein a first terminal of the denoising circuit is connected to the gate signal output terminal, a second terminal of the denoising circuit is connected to the pull-up node, a third terminal of the denoising circuit is connected to the fourth reference signal terminal, and a fourth terminal of the denoising circuit is connected to a denoising signal terminal;
- the denoising circuit is configured to supply a signal of the fourth reference signal terminal to the gate signal output terminal and the pull-up node under control of a denoising signal of the denoising signal terminal.

17. A gate driving circuit, comprising a plurality of cascaded shift registers according to claim 1.

18. A display device, comprising the gate driving circuit of claim 17.

19. A driving method of the shift register according to claim 1, comprising:
- receiving an input signal, and pulling up the pull-up node to a turn-on voltage level according to the input signal;
- maintaining the potential of the pull-up node at the turn-on voltage level by using the pull-up node potential maintaining circuit; and
- receiving a first clock signal and outputting a gate enabling signal at the output terminal under control of the state of the pull-up node based on the first clock signal.

20. The driving method of claim 19, further comprising:
- receiving a reset signal, and pulling down the pull-up node to a turn-off voltage level according to the reset signal;
- maintaining the state of the pull-up node at the turn-off voltage level by the pull-up node potential maintaining circuit.

* * * * *